(12) United States Patent
Mun et al.

(10) Patent No.: US 12,060,501 B2
(45) Date of Patent: Aug. 13, 2024

(54) OPTICAL DISPLAY COMPRISING AN ADHESIVE FILM

(71) Applicant: SAMSUNG SDI CO., LTD., Yongin-si (KR)

(72) Inventors: Sung Hyun Mun, Suwon-si (KR); Ki Yong Kim, Suwon-si (KR); Jee Hee Kim, Suwon-si (KR); Chan Woo Kim, Suwon-si (KR); Ik Hwan Cho, Suwon-si (KR); In Cheon Han, Suwon-si (KR)

(73) Assignee: SAMSUNG SDI CO., LTD., Yongin-si (KR)

(*) Notice: Subject to any disclaimer, the term of this patent is extended or adjusted under 35 U.S.C. 154(b) by 979 days.

(21) Appl. No.: 17/022,217

(22) Filed: Sep. 16, 2020

(65) Prior Publication Data
US 2020/0407606 A1 Dec. 31, 2020

Related U.S. Application Data

(62) Division of application No. 14/699,428, filed on Apr. 29, 2015, now Pat. No. 10,815,400.

(30) Foreign Application Priority Data

Apr. 30, 2014 (KR) .................. 10-2014-0052965

(51) Int. Cl.
C09J 133/06 (2006.01)
C08F 220/04 (2006.01)
(Continued)

(52) U.S. Cl.
CPC ......... *C09J 133/066* (2013.01); *C08F 220/20* (2013.01); *C09J 7/00* (2013.01);
(Continued)

(58) Field of Classification Search
None
See application file for complete search history.

(56) References Cited

U.S. PATENT DOCUMENTS 4,131,602 A  12/1978  Hodakowski et al.
6,228,965 B1*  5/2001  Muta .................... C09J 9/00
                                              428/476.3
(Continued)

FOREIGN PATENT DOCUMENTS

JP   2007-169421 A   7/2007
KR   10-2013-0046971 A   5/2013
(Continued)

OTHER PUBLICATIONS

Dzunuzovic—UV-curable hyperbranched urethane acrylate oligomers—Prog.Org.Chem.—2005 (Year: 2005).*
(Continued)

*Primary Examiner* — John Vincent Lawler
(74) *Attorney, Agent, or Firm* — Lee IP Law, P.C.

(57) ABSTRACT

An adhesive film and an optical display, the adhesive film being prepared from an adhesive composition that includes a (meth)acrylic copolymer, wherein the adhesive film has an elongation of about 750% to about 3,000%, and satisfies the following Equation 1:

PB/PY=about 3.0 to about 20, wherein PB is a break point in gf of the adhesive film and PY is a yield point in gf of the adhesive film.

9 Claims, 3 Drawing Sheets

(51) Int. Cl.
*C08F 220/06* (2006.01)
*C08F 220/18* (2006.01)
*C08F 220/20* (2006.01)
*C08F 220/32* (2006.01)
*C09J 7/00* (2018.01)
*C09J 7/10* (2018.01)
*C09J 133/08* (2006.01)
*C09J 133/10* (2006.01)
*C09J 133/12* (2006.01)
*C09J 133/14* (2006.01)
*H10K 50/00* (2023.01)
*H10K 50/80* (2023.01)
*H10K 50/84* (2023.01)
*H10K 59/00* (2023.01)
*H10K 85/10* (2023.01)

(52) U.S. Cl.
CPC ............ *C09J 7/10* (2018.01); *C09J 133/062* (2013.01); *C09J 133/068* (2013.01); *C09J 133/14* (2013.01); *H10K 50/00* (2023.02); *H10K 50/80* (2023.02); *H10K 50/84* (2023.02); *H10K 59/00* (2023.02); C08F 220/04 (2013.01); C08F 220/06 (2013.01); C08F 220/18 (2013.01); C08F 220/1808 (2020.02); C08F 220/32 (2013.01); C09J 133/08 (2013.01); C09J 133/10 (2013.01); C09J 133/12 (2013.01); C09J 2203/318 (2013.01); C09J 2301/312 (2020.08); C09J 2433/00 (2013.01); C09J 2475/00 (2013.01); H10K 85/151 (2023.02)

(56) References Cited

U.S. PATENT DOCUMENTS

| | | | |
|---|---|---|---|
| 6,372,074 B1 | 4/2002 | Holguin et al. | |
| 6,756,072 B2* | 6/2004 | Baumgart | C08G 18/807 |
| | | | 525/934 |
| 7,063,887 B2 | 6/2006 | Kobe et al. | |
| 2002/0164446 A1 | 11/2002 | Zhou et al. | |
| 2005/0065252 A1* | 3/2005 | Kawamura | C08L 39/06 |
| | | | 525/203 |
| 2006/0036040 A1* | 2/2006 | Takeko | C09J 133/04 |
| | | | 525/192 |
| 2006/0100299 A1 | 5/2006 | Malik et al. | |
| 2006/0188725 A1* | 8/2006 | Yoshida | C09J 175/04 |
| | | | 428/411.1 |
| 2008/0145572 A1* | 6/2008 | Yano | C09J 7/385 |
| | | | 428/1.54 |
| 2009/0087650 A1* | 4/2009 | Inoue | C09J 7/385 |
| | | | 526/260 |
| 2009/0270557 A1* | 10/2009 | Tomita | C09J 7/385 |
| | | | 525/100 |
| 2011/0253301 A1* | 10/2011 | Yamanaka | B32B 27/32 |
| | | | 156/247 |
| 2012/0171481 A1 | 7/2012 | Ha et al. | |
| 2012/0301715 A1* | 11/2012 | Weikel | C08L 63/10 |
| | | | 522/31 |
| 2013/0011658 A1 | 1/2013 | Okamoto et al. | |
| 2013/0040123 A1* | 2/2013 | Cho | G02B 5/3033 |
| | | | 526/260 |
| 2014/0078077 A1* | 3/2014 | Choi | H10K 50/8426 |
| | | | 345/173 |
| 2014/0079947 A1* | 3/2014 | Tamura | C09J 7/385 |
| | | | 428/354 |
| 2015/0130751 A1* | 5/2015 | Teraguchi | G06F 3/0412 |
| | | | 345/80 |

FOREIGN PATENT DOCUMENTS

KR 10-2010-0013812 A 10/2014
WO WO 2012/128311 A1 9/2012

OTHER PUBLICATIONS

Shin-Etsu—Silane Coupling Agents—Oct. 2023 (Year: 2023).*
Korean Office Action issued Jul. 25, 2016 in the corresponding Korean Patent Application No. 2014-0052965; Mun, et al.

* cited by examiner

OPTICAL DISPLAY COMPRISING AN ADHESIVE FILM

CROSS-REFERENCE TO RELATED APPLICATIONS

This is a divisional application based on pending application Ser. No. 14/699,428, filed Apr. 29, 2015, the entire contents of which is hereby incorporated by reference.

Korean Patent Application No. 10-2014-0052965, filed on Apr. 30, 2014, in the Korean Intellectual Property Office, and entitled: "Adhesive Film and Optical Display Comprising the Same," is incorporated by reference herein in its entirety.

BACKGROUND

1. Field

Embodiments relate to an adhesive film and an optical display including the same.

2. Description of the Related Art

A touchscreen panel may include a sensor layer including a conductive layer, a window, and an adhesive film, which attaches the sensor layer to the window. The touchscreen panel may be prepared by stacking the adhesive film on one of the sensor layer and the window, followed by attaching the other onto the adhesive film.

SUMMARY

Embodiments are directed to an adhesive film and an optical display including the same.

The embodiments may be realized by providing an adhesive film prepared from an adhesive composition that includes a (meth)acrylic copolymer, wherein the adhesive film has an elongation of about 750% to about 3,000%, and satisfies the following Equation 1:

$PB/PY$=about 3.0 to about 20, wherein PB is a break point in grams-force (gf) of the adhesive film and PY is a yield point in gf of the adhesive film.

The adhesive film may has an elongation of about 750% to about 1,500%.

The adhesive film may satisfy the following Equation 1:

$PB/PY$=about 3.0 to about 5.0, [Equation 1]

wherein PB is a break point in gf of the adhesive film and PY is a yield point in gf of the adhesive film.

The adhesive film may have a yield point of about 60 gf to about 120 gf, and a break point of about 220 gf to about 380 gf.

The adhesive composition may further include a crosslinking agent, the crosslinking agent comprising a bi-functional urethane (meth)acrylate, and an initiator.

The (meth)acrylic copolymer may be prepared from a monomer mixture that includes about 20 wt % to about 80 wt % of an alkyl group-containing (meth)acrylic monomer, and about 20 wt % to about 80 wt % of a hydroxyl group-containing (meth)acrylic monomer, all wt % being based on a total weight of the monomer mixture.

The (meth)acrylic copolymer may be prepared from a monomer mixture that includes about 80 wt % to about 90 wt % of an alkyl group-containing (meth)acrylic monomer, about 5 wt % to about 15 wt % of a carboxylic acid group-containing (meth)acrylic monomer, and about 1 wt % to about 10 wt % of a hetero-alicyclic group-containing (meth)acrylic monomer, all wt % being based on a total weight of the monomer mixture.

The adhesive composition may further include a silane coupling agent.

The embodiments may be realized by providing an optical display including the adhesive film according to an embodiment.

The optical display may include a substrate; an OLED element on the substrate; an encapsulation layer encapsulating the OLED element; and a first adhesive film on the encapsulation layer, the first adhesive film including the adhesive film.

BRIEF DESCRIPTION OF THE DRAWINGS

Features will be apparent to those of skill in the art by describing in detail exemplary embodiments with reference to the attached drawings in which.

DETAILED DESCRIPTION

Figure 1:
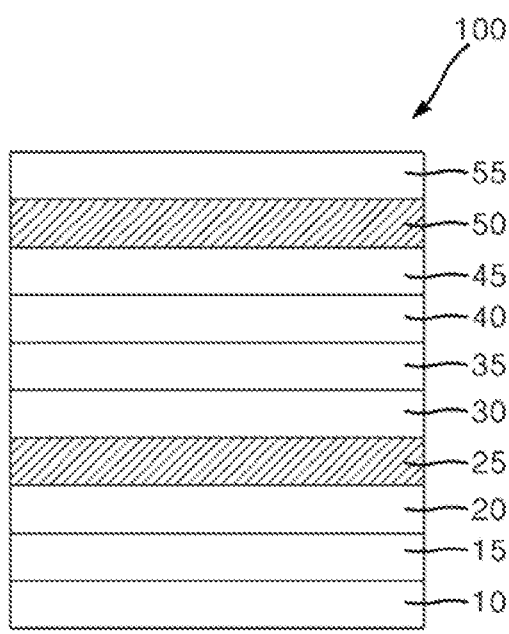
FIG. 1 illustrates a sectional view of an organic light emitting display according to an embodiment.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. Like reference numerals refer to like elements throughout.

As used herein, directional terms such as "upper" and "lower" are defined with reference to the accompanying drawings. Thus, it will be understood that the term "upper side (surface)" can be used interchangeably with "lower side (surface)". The term "(meth)acrylate" may refer to acrylates and/or methacrylates The adhesive film according to the embodiment may include, e.g., a (meth)acrylic copolymer, and may have, e.g., a ratio of break point PB to yield point PY (break point/yield point) of about 3.0 or more and an elongation of about 750% or more. With a ratio of break point to yield point of about 3.0 or more and an elongation of about 750% or more, the adhesive film may exhibit good reworkability and durability. In an implementation, the adhesive film may have a ratio of break point to yield point of, e.g., about 3.0 to about 20 or about 3.0 to about 5.0. In an implementation, the adhesive film may have an elongation of, e.g., about 750% or more, about 750% to about 3,000%, or about 750% to about 1,500%. For example, the ratio may satisfy the following Equation 1: PB/PY≥about 3.0, in which PB is the break point in gf of the adhesive film and PY is the yield point in gf of the adhesive film.

The adhesive film may have, e.g., a yield point of about 60 gf to about 120 gf and/or a break point of about 220 gf to about 380 gf. Within this range, the adhesive film may exhibit good reworkability and durability.

The adhesive film according to this embodiment may be formed of or prepared from an adhesive composition. For example, the adhesive film may be formed by coating the adhesive composition onto a release film, followed by curing. In an implementation, the adhesive composition may be prepared using or may include, e.g., a (meth)acrylic copolymer. The (meth)acrylic copolymer may be prepared through complete or partial polymerization of, e.g., a monomer mixture for the (meth)acrylic copolymer, an initiator, a crosslinking agent, and a silane coupling agent. Curing may be performed using a low pressure lamp at an irradiance of about 30 mW/cm$^2$ to about 200 mW/cm$^2$ for about 1 minute to about 30 minutes. In an implementation, curing may be performed under oxygen blocking conditions.

The adhesive film may be used as an optically clear adhesive (OCA) film, or as an adhesive optical film formed on an optical film. An example of the optical film may include a polarizing plate. The polarizing plate may include a polarizer and a protective film on the polarizer, and may further include, e.g., a hard coating layer, an anti-reflection layer, or the like.

The adhesive film may have a thickness of about 50 μm or more, e.g., about 50 μm to about 250 μm. Within this range, the adhesive film may be applied to optical displays.

The (meth)acrylic copolymer may be a copolymer of a monomer mixture that includes, e.g., at least one of an alkyl group-containing (meth)acrylic monomer, a hydroxyl group-containing (meth)acrylic monomer, a carboxylic acid group-containing (meth)acrylic monomer, and a hetero-alicyclic group-containing (meth)acrylic monomer.

In an implementation, the (meth)acrylic copolymer may be a copolymer of a monomer mixture including, e.g., the alkyl group-containing (meth)acrylic monomer and the hydroxyl group-containing (meth)acrylic monomer. For example, the monomer mixture may include about 20 wt % to about 80 wt % of the alkyl group-containing (meth)acrylic monomer and about 20 wt % to about 80 wt % of the hydroxyl group-containing (meth)acrylic monomer, based on a total weight of the monomer mixture. Within this range, the adhesive film may exhibit good reworkability and durability, and may provide improved adhesion.

The alkyl group-containing (meth)acrylic monomer may include, e.g., a (meth)acrylic acid ester having an unsubstituted $C_1$ to $C_{20}$ linear or branched alkyl group. In an implementation, the alkyl group-containing (meth)acrylic monomer may include, e.g., at least one of methyl (meth)acrylate, ethyl (meth)acrylate, propyl (meth)acrylate, n-butyl (meth)acrylate, t-butyl (meth)acrylate, isobutyl (meth)acrylate, pentyl (meth)acrylate, hexyl (meth)acrylate, heptyl (meth)acrylate, ethylhexyl (meth)acrylate, octyl (meth)acrylate, isooctyl (meth)acrylate, nonyl (meth)acrylate, decyl (meth)acrylate, and lauryl (meth)acrylate. In an implementation, a $C_4$ to $C_8$ alkyl group-containing (meth)acrylic monomer may used to help provide further improved durability. In an implementation, the alkyl group-containing (meth)acrylic monomer may be present in the monomer mixture in an amount of, e.g., about 20 wt % to about 90 wt %. Within this range, the adhesive composition may exhibit further improved adhesion.

The hydroxyl group-containing (meth)acrylic monomer may include, e.g., a $C_1$ to $C_{20}$ alkyl group-containing (meth)acrylic acid ester having at least one hydroxyl group, a $C_5$ to $C_{20}$ cycloalkyl group-containing (meth)acrylic acid ester having at least one hydroxyl group, or a $C_6$ to $C_{20}$ aryl group-containing (meth)acrylic acid ester having at least one hydroxyl group. In an implementation, the hydroxyl group-containing (meth)acrylic monomer may include, e.g., at least one of 2-hydroxyethyl(meth)acrylate, 4-hydroxybutyl (meth)acrylate, 2-hydroxypropyl (meth)acrylate, 2-hydroxybutyl (meth)acrylate, and 6-hydroxyhexyl (meth)acrylate. In an implementation, a $C_1$ to $C_5$ alkyl group-containing (meth)acrylic monomer having a hydroxyl group may help provide an additional effect of improving durability (e.g., an effect of preventing a whitening phenomenon). In an implementation, the hydroxyl group-containing (meth)acrylic monomer may be present in the monomer mixture in an amount of, e.g., about 20 wt % to about 80 wt %. Within this range, the adhesive composition can exhibit improved adhesion.

In an implementation, the (meth)acrylic copolymer may be, e.g., a copolymer of a monomer mixture including the alkyl group-containing (meth)acrylic monomer, the carboxylic acid group-containing (meth)acrylic monomer, and the hetero-alicyclic group-containing (meth)acrylic monomer. For example, the monomer mixture may include about 80 wt % to about 90 wt % of the alkyl group-containing (meth)acrylic monomer, about 5 wt % to about 15 wt % of the carboxylic acid group-containing (meth)acrylic monomer, and about 1 wt % to about 10 wt % of the hetero-alicyclic group-containing (meth)acrylic monomer, based on the total weight of the monomer mixture. Within this range, the adhesive composition may exhibit improved adhesion.

The hetero-alicyclic group-containing (meth)acrylic monomer may include, e.g., a $C_2$ to $C_5$ alicyclic group-containing (meth)acrylic monomer having a hetero atom (e.g., nitrogen, oxygen, or sulfur), and may be, e.g., N-(meth)acryloylmorpholine. In an implementation, the hetero-alicyclic group-containing (meth)acrylic monomer may be present in the monomer mixture in an amount of about 10 wt % or less, e.g., about 1 wt % to about 10 wt %. Within this range, the adhesive composition may exhibit improved adhesion.

The carboxylic acid group-containing (meth)acrylic monomer may include, e.g., (meth)acrylic acid. In an implementation, the carboxylic acid group-containing (meth)acrylic monomer may be present in the monomer mixture in an amount of about 15 wt % or less, e.g., about 5 wt % to about 15 wt %. Within this range, the adhesive composition may exhibit improved adhesion.

The (meth)acrylic copolymer may have a weight average molecular weight of, e.g., about 1,000,000 g/mol to about 4,000,000 g/mol or about 1,500,000 g/mol to about 3,000,000 g/mol. Within this range, the adhesive composition may exhibit improved durability.

The (meth)acrylic copolymer may have a glass transition temperature of, e.g., about −50° C. to about −5° C. or about −30° C. to about −10° C. Within this range, the adhesive composition may exhibit improved durability.

The (meth)acrylic copolymer be prepared by a suitable method. For example, the (meth)acrylic copolymer may be prepared by mixing the monomer mixture with a radical photopolymerization initiator, followed by solution polymerization, suspension polymerization, photopolymerization, bulk polymerization, or emulsion polymerization. For example, solution polymerization may be performed at about 50° C. to about 100° C. after adding the initiator to the monomer mixture. The radical photopolymerization initiator may include an acetophenone-based radical photopolymerization initiator, e.g., 2,2-dimethoxy-2-phenylacetophenone or the like.

In an implementation, the (meth)acrylic copolymer may be prepared through complete polymerization of the monomer mixture. In an implementation, the (meth)acrylic copolymer may be prepared by partially polymerizing the monomer mixture, adding the initiator and a crosslinking agent to the monomer mixture, followed by additional polymerization. In partial polymerization, the monomer mixture may be polymerized to a viscosity (at 25° C.) of about 1,500 cPs or less, e.g., about 1,100 cPs to about 1,500 cPs.

The photopolymerization initiator may include a radical photopolymerization initiator. In this case, the same or different initiator from the initiator used in preparation of the (meth)acrylic copolymer may be used. In an implementation, the initiator may be present in the adhesive composition in an amount of about 0.001 to about 1 part by weight, based on 100 parts by weight of the (meth)acrylic copolymer, and may help improve durability of the adhesive composition.

In an implementation, the silane coupling agent may include, e.g., an epoxy silane coupling agent. The silane coupling agent may be present in an amount of about 0.01 to about 0.1 parts by weight, e.g., about 0.05 to about 0.1 parts by weight, based on 100 parts by weight of the monomer mixture or the (meth)acrylic copolymer. Within this range, the adhesive composition may exhibit improved durability and adhesion.

With the crosslinking agent, the adhesive film may have a ratio of yield point to break point of about 3.0 or more and an elongation of about 600% or more, e.g., about 750% or more. Within this range, the adhesive film may exhibit improved properties in terms of reworkability, durability and adhesion. In an implementation, the crosslinking agent may include, e.g., a bi-functional urethane (meth)acrylate.

The bi-functional urethane (meth)acrylate may include a $C_7$ or higher alkyl long-chain, e.g., a $C_7$ to $C_{18}$ alkyl long-chain. Thus, the adhesive film may have higher elongation than adhesive films using other crosslinking agents, e.g. 1,6-hexanediol di(meth)acrylate, thereby securing improved reworkability and durability. The bi-functional urethane (meth)acrylate may have a viscosity (at 25° C.) of about 20,000 mPa·s to about 30,000 mPa·s, and/or a glass transition temperature of about −40° C. to about −20° C. Within this range, the adhesive film may have high elongation. In an implementation, the crosslinking agent may include, e.g., UF-07DF.

The crosslinking agent may further include a suitable crosslinking agent, in addition to the bi-functional urethane (meth)acrylate. In an implementation, the crosslinking agent may include a bi-functional acrylate, e.g., 1,4-butanediol di(meth)acrylate, 1,6-hexanediol di(meth)acrylate, neopentylglycol di(meth)acrylate, polyethyleneglycol di(meth)acrylate, neopentylglycol adipate di(meth)acrylate, dicyclopentanyl di(meth)acrylate, caprolactone-modified dicyclopentenyl di(meth)acrylate, ethylene oxide-modified di(meth)acrylate, di(meth)acryloxy ethyl isocyanurate, allylated cyclohexyl di(meth)acrylate, tricyclodecane dimethanol (meth)acrylate, dimethylol dicyclopentane di(meth)acrylate, ethylene oxide-modified hexahydrophthalic acid di(meth)acrylate, tricyclodecane dimethanol (meth)acrylate, neopentylglycol-modified trimethylpropane di(meth)acrylate, adamantane di(meth)acrylate, or 9,9-bis[4-(2-acryloyloxyethoxy)phenyl]fluorine; a tri-functional acrylate, e.g., trimethylolpropane tri(meth)acrylate, dipentaerythritol tri(meth)acrylate, propionic acid-modified dipentaerythritol tri(meth)acrylate, pentaerythritol tri(meth)acrylate, propylene oxide-modified trimethylpropane tri(meth)acrylate, tri-functional urethane (meth)acrylate, or tris(meth)acryloxyethyl isocyanurate; a tetra-functional acrylate, e.g., diglycerin tetra(meth)acrylate or pentaerythritol tetra(meth)acrylate; a penta-functional acrylate, e.g., dipentaerythritol penta(meth)acrylate; or a hexa-functional acrylate, e.g., dipentaerythritol hexa(meth)acrylate, caprolactone-modified dipentaerythritol hexa(meth)acrylate, or urethane (meth)acrylate (e.g., reaction products of an isocyanate monomer and trimethylolpropane tri(meth)acrylate).

The crosslinking agent may be present in an amount of about 0.01 parts by weight to about 5 parts by weight, e.g., about 0.03 parts by weight to about 1 part by weight, based on 100 parts by weight of the (meth)acrylic copolymer. Within this range, the adhesive composition may exhibit improved durability and adhesion.

In an implementation, the adhesive composition may further include an additive, e.g., a curing accelerator, an ionic liquid, a lithium salt, an inorganic filler, a softening agent, an antioxidant, an anti-aging agent, a stabilizer, a tackifier resin, a modifying resin (such as a polyol resin, a phenol resin, an acrylic resin, a polyester resin, a polyolefin resin, an epoxy resin, an epoxidized polybutadiene resin, or the like), a leveling agent, an antifoaming agent, a plasticizer, a dye, a pigment (such as a coloring pigment, an extender pigment, or the like), a treatment agent, a UV protective agent, a fluorescence brightening agent, a dispersant, a heat stabilizer, a light stabilizer, a UV absorbent, an antistatic agent, a lubricant, a solvent, or the like, as desired.

According to one embodiment, an optical display may include the adhesive film or an adhesive optical film. In an implementation, the optical display may be an organic light emitting display or a liquid crystal display, which includes the adhesive film or the adhesive optical film.

In one embodiment, the optical display may include a substrate; an OLED element on the substrate; an encapsulation layer encapsulating the OLED element; and a first adhesive film on the encapsulation layer. For example, the first adhesive film may include the adhesive film according to an embodiment.

FIG. 1 illustrates a sectional view of an organic light emitting display according to one embodiment. Referring to FIG. 1, an organic light emitting display 100 according to one embodiment may include, e.g., a substrate 10; an OLED element 15 on the substrate 10; an encapsulation layer 20 encapsulating the OLED element 15; a first adhesive film 25 on the encapsulation layer 20; a base member 35 on the first adhesive film 25; a first transparent conductive layer 40 on an upper side of the base member 35 and a second transparent conductive layer 30 on a lower side of the base member 35; a polarizing plate 45 on an upper side of the first transparent conductive layer 40; a second adhesive film 50 on an upper side of the polarizing plate 45; and a window 55 on an upper side of the second adhesive film 50. At least one of the first adhesive film 25 and the second adhesive film 50 may be or include the adhesive film according to an embodiment.

The substrate 10 may be a suitable substrate, e.g., a TFT substrate, for an organic light emitting display. For example, the substrate may include a glass substrate, a plastic substrate (formed of polyimide, epoxy resin, or acrylic resin), a silicone or silicon substrate, or the like. In an implementation, the substrate may be a flexible substrate.

The OLED element 15 may be an element suitably used in an OLED display. In an implementation, the OLED may include a first electrode, a second electrode, and an organic light emitting layer between the first electrode and the second electrode. The organic light emitting layer may be formed by, e.g., sequentially stacking a hole injection layer, a hole transport layer, a light emitting layer, an electron transport layer, and/or an electron injection layer.

The encapsulation layer 20 may protect the OLED element 15 from external moisture or oxygen. The encapsulation layer 20 may be formed of, e.g., an inorganic material, an organic material, or a mixture thereof.

A transparent conductor may exhibit conductivity and may generate electrical signals in response to external stimulus, e.g., like a touch panel. The transparent conductor may include the base member 35, and the first transparent conductive layer 40 and the second transparent conductive layer 30, which may be respectively formed on both surfaces of the base member 35. The base member 35 may be an optically transparent film (e.g. a polyester film including polycarbonate, polyethylene terephthalate, or the like) or a glass plate. The first transparent conductive layer 40 may be formed of a same material as or a different material from that of the second transparent conductive layer 30. A suitable transparent conductive film having conductivity may be used for the first and the second transparent conductive layers. For example, an indium tin oxide (ITO) film or a metal nanowire-containing film may be used. In an implementation, the first transparent conductive layer 40 and/or the second transparent conductive layer 30 may formed in a predetermined pattern.

The first adhesive film 25 may attach the encapsulation layer 20 to the second transparent conductive layer 30, and the second adhesive film 50 may attach the first transparent conductive layer 40 or the polarizing plate 45 to the window 55. The first adhesive film 25 may be formed of a same material as or a different material from that of the second adhesive film 50. In an implementation, the first and second adhesive films may each include an adhesive film according to an embodiment.

The polarizing plate 45 may act as an anti-reflection layer in the OLED. In an implementation, the polarizing plate may include a polarizer and a protective film on the polarizer.

The window 55 may act as a display member. The window may be formed of a glass or plastic material. In an implementation, the window 55 may be formed of a flexible material.

Figure 2:
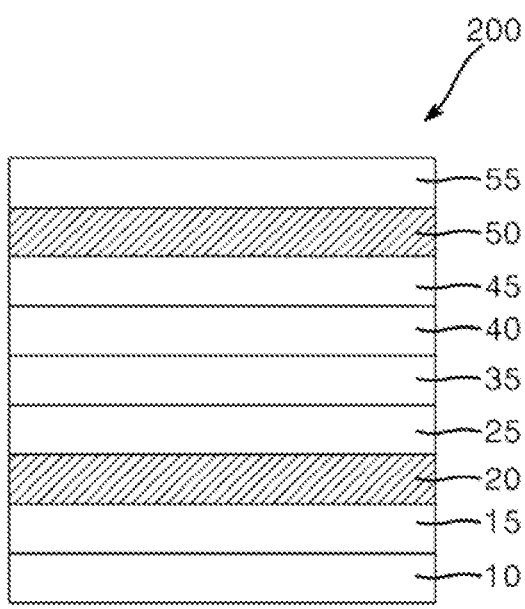
FIG. 2 illustrates a sectional view of an organic light emitting display according to another embodiment.

FIG. 2 illustrates a sectional view of an organic light emitting display according to another embodiment.

Referring to FIG. 2, an organic light emitting display 200 according to one embodiment may include, e.g., a substrate 10; an OLED element 15 on the substrate 10; an encapsulation layer 20 encapsulating the OLED element 15; a first adhesive film 25 on the encapsulation layer 20; a base member 35 on the first adhesive film 25; a transparent conductor (including a first transparent conductive layer 40) on an upper side of the base member 35; a polarizing plate 45 on an upper side of the first transparent conductive layer 40; a second adhesive film 50 on an upper side of the polarizing plate 45; and a window 55 on an upper side of the second adhesive film 50. At least one of the first adhesive film 25 and the second adhesive film 50 may be the adhesive film according to an embodiment.

The organic light emitting display according to the present embodiment may be the same as the organic light emitting display as shown in FIG. 1, except that the organic light emitting display according to the present embodiment may not include the second transparent conductive layer 30.

In an implementation, the organic light emitting display according to an embodiment may be operated without the encapsulation layer 20 and/or the polarizing plate 45. Thus, the encapsulation layer 20 and/or the polarizing plate 45 may be omitted, as desired.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1

20 parts by weight of 2-ethyl hexyl acrylate (EHA), 80 parts by weight of 2-hydroxyethyl acrylate (HEA), and 0.05 parts by weight of a photopolymerization initiator Irgacure 651 (2,2-dimethoxy-2-phenylacetophenone) were sufficiently mixed in a glass container. Nitrogen was supplied into the glass container to replace oxygen therein. The mixture was subjected to partial polymerization through irradiation with UV light using a low pressure lamp for several minutes to obtain a viscous liquid having a viscosity of about 1500 cPs. Then, 0.05 parts by weight of a silane coupling agent (siloxane compound, epoxy silane, X-41-1059A), 0.23 parts by weight of a photopolymerization initiator Irgacure 651, and 0.1 parts by weight of a cross-linking agent (KYOEISHA, UF-07DF, viscosity at 25° C. of 27,000 mPa·s, glass transition temperature of −33° C.) were added to the composition, and sufficiently mixed. Then, the prepared mixture was coated to a thickness of 175 μm onto a polyester film (release film, polyethylene terephthalate film, thickness: 50 μm) to form a coating layer. With a release film covering the coating layer, the mixture was irradiated with UV light using a low pressure lamp for 3 minutes, thereby preparing a transparent adhesive sheet including a 175 μm thick adhesive film.

Examples 2 to 4

An adhesive sheet was prepared by the same method as in Example 1 except that the monomer mixture for forming the copolymer was changed as shown in Table 1.

Example 5

85 parts by weight of 2-ethyl hexyl acrylate (EHA), 13 parts by weight of acrylic acid (AA), 2 parts by weight of acryloylmorpholine (ACMO), and 0.05 parts by weight of a photopolymerization initiator Irgacure 651 (2,2-dimethoxy-2-phenylacetophenone) were sufficiently mixed in a glass container. Nitrogen was supplied into the glass container to replace oxygen therein. The mixture was subjected to partial polymerization through irradiation with UV light using a low pressure lamp for several minutes to obtain a viscous liquid having a viscosity of about 1,500 cPs. Then, 0.05 parts by weight of a silane coupling agent (siloxane compound, epoxy silane, X-41-1059A), 0.23 parts by weight of a photopolymerization initiator Irgacure 651, and 0.1 parts by weight of a crosslinking agent (KYOEISHA, UF-07DF, viscosity at 25° C. of 27,000 mPa·s, glass transition temperature of −33° C.) were added to the composition, and sufficiently mixed. Then, the prepared mixture was coated to a thickness of 200 μm onto a polyester film (release film, polyethylene terephthalate film, thickness: 50 μm) to form a coating layer. With a release film covering the coating layer, the mixture was irradiated with UV light using a low pressure lamp for 3 minutes, thereby preparing a transparent adhesive sheet including a 200 μm thick adhesive film.

Comparative Examples 1 and 2

Adhesive sheets were prepared by the same method as in Example 1 except that the monomer mixture for forming the copolymer was changed as listed in Table 1 (in which IBOA is isobornyl acrylate), and 1,6-hexanediol acrylate was used as a crosslinking agent instead of UF-07DF.

The adhesive sheets prepared in Examples and Comparative Examples were evaluated as to the following properties, and results are shown in Table 1.

TABLE 1

|  |  | Example | | | | | Comparative Example | |
|---|---|---|---|---|---|---|---|---|
|  |  | 1 | 2 | 3 | 4 | 5 | 1 | 2 |
| Monomers | EHA | 20 | 65 | 60 | 50 | 85 | 90 | 50 |
| for | IBOA | — | — | — | — | — | — | 50 |
| (meth)acrylic | HEA | 80 | 35 | 40 | 50 | — | 10 | — |
| copolymer | AA | — | — | — | — | 13 | — | — |
|  | ACMO | — | — | — | — | 2 | — | — |
| Initiator | | 0.23 | 0.23 | 0.23 | 0.23 | 0.23 | 0.23 | 0.23 |
| Crosslinking agent | | 0.1 | 0.1 | 0.1 | 0.1 | 0.1 | 0.1 | 0.1 |
| Silane coupling agent | | 0.05 | 0.05 | 0.05 | 0.05 | 0.05 | 0.05 | 0.05 |
| Curing method | | UV curing | UV curing | UV curing | UV curing | UV curing | UV curing | UV curing |
| Yield point (gf) | | 71.8 | 76.3 | 81.4 | 115 | 69.7 | 67.8 | 98.9 |
| Break point (gf) | | 220.4 | 307.8 | 321.1 | 372.3 | 253.4 | 131.5 | 286.7 |
| Ratio of break point to yield point (break point/yield point) | | 3.1 | 4.0 | 3.9 | 3.2 | 3.6 | 1.9 | 2.9 |
| Elongation (%) | | 1,040 | 930 | 870 | 770 | 946 | 1,100 | 690 |
| Reworkability | | Good | Good | Good | Good | Good | Poor | Poor |
| Durability | | ○ | ○ | ○ | ○ | ○ | x | x |

As may be seen in Table 1, the adhesive films according to Examples 1 to 5 had good reworkability and durability. Conversely, each of the adhesive films of Comparative Examples 1 and 2 had a ratio of break point to yield point of less than 3.0, and exhibited poor reworkability or durability.

Figure 3:
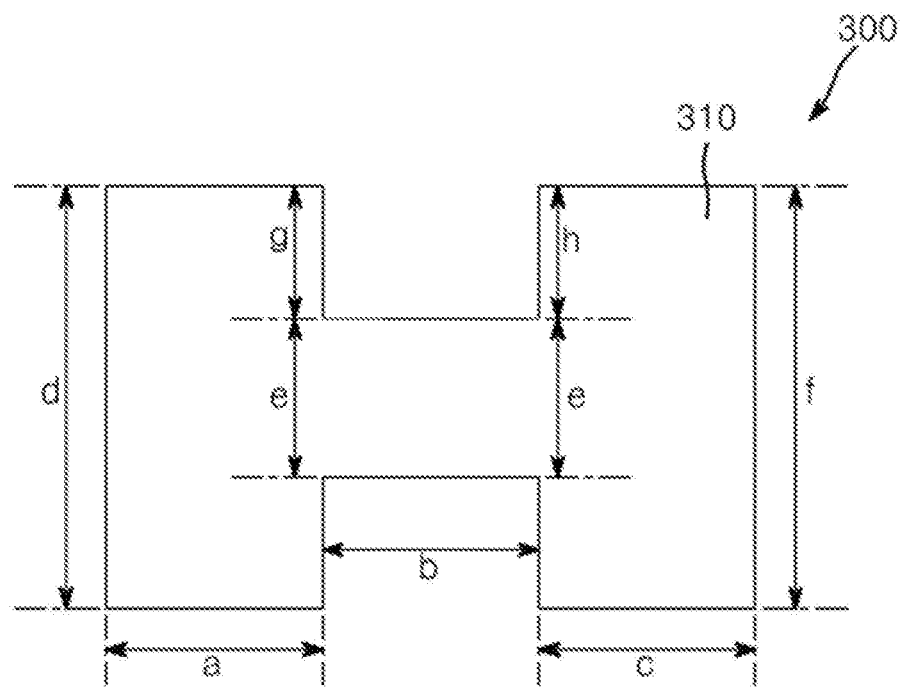
FIG. 3 illustrates a diagram of a specimen for measurement of a yield point and a break point.
Figure 4:
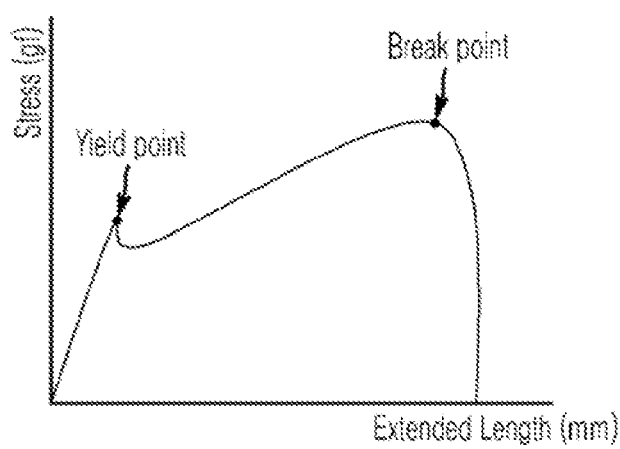
FIG. 4 illustrates a graph depicting a stress-strain curve for measurement of a yield point and a break point.

1) Yield point and break point: A specimen as shown in FIG. 3 was prepared using a 200 μm thick adhesive film. FIG. 3 illustrates an adhesive film specimen 300 for measurement of a yield point and a break point. An adhesive film 310 was cut in a dog bone shape. For example, 'a' was set to 2 cm, 'b' was set to 1.5 cm, 'c' was set to 2 cm, 'd' was set to 3 cm, 'e' was set to 1.5 cm, 'f' was set to 3 cm, 'g' was set to 1 cm, and 'h' was set to 1 cm, respectively. The yield point and the break point were measured using a TA instrument (Texture Technologies Corp. & Stable Microsystems, TA XT PLUS). In the adhesive film specimen 300, a portion defined by a width "a" (2 cm) and a length "d" (3 cm) was secured to the TA instrument. Then, a section defined by a width "c" (2 cm) and a length "f" (3 cm) was stretched at a speed of 2,400 mm/min. The yield point indicates stress at which the specimen begins to deform physically, and the break point indicates stress immediately before fracture of the specimen occurs. FIG. 4 illustrates a graph depicting stress-strain curve for measurement of a yield point and a break point, in which the x-axis indicates an extended length of the specimen (unit: mm) and the y-axis indicates tensile stress (unit: gf) applied to the specimen. In FIG. 4, the "extended length" of the specimen was obtained by subtracting a length "b" (1.5 cm) from the length of the specimen to which tensile stress is applied.

2) Elongation: An adhesive film specimen was prepared by the same method as in measurement of the yield point and the break point. In the adhesive film specimen 300, a section defined by a width "a" (2 cm) and a length "d" (3 cm) was secured to a TA instrument (Texture Technologies Corp. & Stable Microsystems, TA XT PLUS). Then, a section defined by a width "c" (2 cm) and a length "f" (3 cm) was stretched at 2,400 mm/min. Elongation was calculated according to the following equation: (Extended length of Section b until fracture of Section b upon application of tensile stress)/(original length of Section b)×100.

3) Reworkability: An adhesive film was cut into a specimen having a size of 5 cm×110 cm (width×length), which in turn was attached to a glass plate. Then, the specimen was rubbed using a rubber hand roll and then manually stretched. An adhesive film specimen that was smoothly peeled off the glass plate without fracture was evaluated as "good", and an adhesive film specimen that was not peeled off or broken was evaluated as "poor".

4) Durability: An adhesive film specimen was prepared by attaching the polarizing plates (90 mm×170 mm, width× length) coated with the adhesive films prepared in the Examples and Comparative Examples to both sides of a glass substrate (110 mm×190 mm×0.7 mm, width×length× thickness) such that optical absorption axes crossed each other orthogonally. Here, pressure was performed by applying a pressure to the specimen of about 5 kg/cm² in a clean room so as to prevent generation of bubbles and introduction of foreign matter. To evaluate moisture/heat resistance, specimens were left under conditions of 60° C. and 90% RH for 1,000 hours, followed by observation of bubbling or delamination. For evaluation of heat resistance, the specimens were left under conditions of 80° C. for 1,000 hours, followed by observation of bubbling or delamination. The specimens were left at room (ambient) temperature for 24 hours immediately before evaluation of the specimens. Evaluation standards were as follows.

○: No bubbling and No delamination

Δ: Slight bubbling or Slight delamination x: plenty of bubbling or plenty of delamination As may be seen from Table 1, the adhesive films prepared in Examples 1 to 5 had a high phase difference and excellent durability, whereas the adhesive films prepared in Comparative Examples 1 and 2 had deteriorated durability.

By way of summation and review, attachment failure, e.g., bubbles, foreign matter, detachment, or the like may occur in the course of attaching an adhesive film to a sensor layer. When there is attachment failure, a rework process may be performed for removing and reattaching the adhesive film.

An adhesive film may be prepared by curing an adhesive composition, and may include a plastic portion and an elastic portion formed by curing. The adhesive film may be stretched upon reworking. In order to allow good reworkability of the adhesive film, the plastic portion of the adhesive film may have good elongation. For example, a double-sided adhesive tape may be used for securing a touchscreen panel.

The embodiments may provide an adhesive film and an optical display including the same, which exhibit improved reworkability and durability.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. An optical display comprising an adhesive film prepared from an adhesive composition that includes a (meth) acrylic copolymer,
wherein the adhesive film has an elongation of about 750% to about 3,000%, and satisfies the following Equation 1:

$PB/PY$=about 3.0 to about 20,     [Equation 1]

wherein:
PB is a break point in grams-force (gf) of the adhesive film and PY is a yield point in gf of the adhesive film,
the elongation is determined as follows:
the adhesive film is cut into a dog bone shape and the elongation is measured using a TA instrument such that the adhesive film is secured to the TA instrument and stretched at 2,400 mm/min, wherein the elongation is calculated according to the following equation: (Extended length until fracture upon application of tensile stress)/(original length)×100, and
the yield point and break point are determined as follows:
the adhesive film is cut into a dog bone shape and the yield point and the break point are measured using a TA instrument such that the adhesive film is secured to the TA instrument and stretched at a speed of 2,400 mm/min, wherein the yield point is a stress at which the specimen begins to deform physically, and the break point is a stress immediately before fracture of the specimen occurs, and
the (meth)acrylic copolymer is prepared from a three-monomer mixture that consists of:
about 80 wt % to about 90 wt % of an alkyl group-containing (meth)acrylic monomer,
greater than 6 wt % to about 15 wt % of a carboxylic acid group-containing (meth)acrylic monomer, and
1 wt % to 5 wt % of a hetero-alicyclic group-containing (meth)acrylic monomer, all wt % being based on a total weight of the monomer mixture.

2. The optical display as claimed in claim 1, wherein the adhesive film has an elongation of about 750% to about 1,500%.

3. The optical display as claimed in claim 1, wherein the adhesive film satisfies the following Equation 1:

$PB/PY$=about 3.0 to about 5.0,     [Equation 1]

wherein PB is a break point in gf of the adhesive film and PY is a yield point in gf of the adhesive film.

4. The optical display as claimed in claim 1, wherein the adhesive film has a yield point of about 60 gf to about 120 gf, and a break point of about 220 gf to about 380 gf.

5. The optical display as claimed in claim 1, wherein the adhesive composition further includes a crosslinking agent, the crosslinking agent comprising a urethane (meth)acrylate, and an initiator.

6. The optical display as claimed in claim 1, wherein the adhesive composition further includes a silane coupling agent.

7. The optical display as claimed in claim 1, wherein the optical display includes:
a substrate;
an OLED element on the substrate;
an encapsulation layer encapsulating the OLED element; and
a first adhesive film on the encapsulation layer, the first adhesive film including the adhesive film.

8. The optical display as claimed in claim 1, wherein the optical display includes:
a substrate;
an OLED element on the substrate;
an encapsulation layer encapsulating the OLED element;
a first adhesive film on the encapsulation layer;
a base member on the first adhesive film;
a first transparent conductive layer on an upper side of the base member and a second transparent conductive layer on a lower side of the base member;
a polarizing plate on an upper side of the first transparent conductive layer;
a second adhesive film on an upper side of the polarizing plate; and
a window on an upper side of the second the adhesive film,
at least one of the first adhesive film and the second adhesive film is or includes the adhesive film.

9. The optical display as claimed in claim 1, wherein the optical display includes:
a substrate;
an OLED element on the substrate;
an encapsulation layer encapsulating the OLED element;
a first adhesive film on the encapsulation layer;
a base member on the first adhesive film;
a transparent conductor including a first transparent conductive layer on an upper side of the base member;
a polarizing plate on an upper side of the first transparent conductive layer;
a second adhesive film on an upper side of the polarizing plate; and
a window on an upper side of the second the adhesive film,
at least one of the first adhesive film and the second adhesive film is the adhesive film.

* * * * *